(12) United States Patent
Chow et al.

(10) Patent No.: US 11,664,332 B2
(45) Date of Patent: May 30, 2023

(54) ALWAYS-ON FINFET WITH CAMOUFLAGED PUNCH STOP IMPLANTS FOR PROTECTING INTEGRATED CIRCUITS FROM REVERSE ENGINEERING

(71) Applicant: Rambus Inc., San Jose, CA (US)

(72) Inventors: Lap Wai Chow, South Pasadena, CA (US); Bryan J. Wang, South Lake Tahoe, CA (US); James P. Baukus, Westlake Village, CA (US); Ronald P. Cocchi, Huntington Beach, CA (US)

(73) Assignee: RAMBUS INC., San Jose, CA (US)

( * ) Notice: Subject to any disclaimer, the term of this patent is extended or adjusted under 35 U.S.C. 154(b) by 60 days.

(21) Appl. No.: 17/157,579

(22) Filed: Jan. 25, 2021

(65) Prior Publication Data

US 2021/0249364 A1 Aug. 12, 2021

Related U.S. Application Data

(60) Provisional application No. 62/966,853, filed on Jan. 28, 2020.

(51) Int. Cl.
| | | |
|---|---|---|
| *H01L 23/00* | (2006.01) | |
| *H01L 29/10* | (2006.01) | |
| *H01L 29/78* | (2006.01) | |
| *H01L 21/8238* | (2006.01) | |
| *H01L 29/66* | (2006.01) | |
| *H01L 27/092* | (2006.01) | |

(52) U.S. Cl.
CPC .... *H01L 23/576* (2013.01); *H01L 21/823821* (2013.01); *H01L 27/0924* (2013.01); *H01L 29/1083* (2013.01); *H01L 29/66795* (2013.01); *H01L 29/785* (2013.01)

(58) Field of Classification Search
CPC .......... H01L 23/576; H01L 21/823821; H01L 27/0924; H01L 29/1083; H01L 29/66795; H01L 29/785
See application file for complete search history.

(56) References Cited

U.S. PATENT DOCUMENTS

2010/0327363 A1* 12/2010 Nakabayashi ........ H01L 29/785
257/E27.06

* cited by examiner

*Primary Examiner* — Cuong B Nguyen
(74) *Attorney, Agent, or Firm* — Gates & Cooper LLP

(57) ABSTRACT

A camouflaged application specific integrated circuit is disclosed. The camouflaged ASIC includes at least one camouflaged FinFET, which includes a substrate of a first conductivity type, a fin, disposed on the substrate, the fin including a source region of a second conductivity type, a drain region of the second conductivity type, and a channel region of the first conductivity type. The camouflaged application specific integrated circuit also includes a gate disposed over and substantially perpendicular to the channel region, forming one or more transistor junctions with the fin. In one embodiment, the substrate includes a punch through stop (PTS) region of the second conductivity type disposed between the fin and the substrate, the PTS region electrically shorting the source region of the fin to the drain region of the fin.

20 Claims, 9 Drawing Sheets

ALWAYS-ON FINFET WITH CAMOUFLAGED PUNCH STOP IMPLANTS FOR PROTECTING INTEGRATED CIRCUITS FROM REVERSE ENGINEERING

CROSS-REFERENCE TO RELATED APPLICATIONS

This application claims benefit of U.S. Provisional Patent Application No. 62/966,853, entitled "ALWAYS-ON FINFET WITH CAMOUFLAGED PUNCH STOP IMPLANTS FOR PROTECTING INTEGRATED CIRCUITS FROM REVERSE ENGINEERING," by Lap Wai Chow, Bryan J. Wang, James P. Baukus, and Ronald P. Cocchi, filed Jan. 28, 2020, which application is hereby incorporated by reference herein.

BACKGROUND

1. Field

The present disclosure relates to systems and methods for protecting circuits from reverse engineering, and in particular, to a camouflaged integrated circuit and methods for producing them.

2. Description of the Related Art

The desire to protect hardware and associated intellectual property from reverse engineering and cloning has long been present. A conventional integrated circuit is susceptible to reverse engineering (RE) using a variety of techniques that analyze the manufactured silicon die and extract a functional circuit model. Once the functional circuit model is extracted, a counterfeit device can be produced that performs the same function as the original circuit, or a function that is intentionally altered with a Trojan circuit. Alternately, a digital circuit may then be emulated by an off-the-shelf microprocessor or Field Programmable Gate Array (FPGA).

Camouflage techniques have been used to protect logic cells in Application Specific Integrated Circuits (ASICs) against reverse engineering attacks. For example, U.S. Pat. Nos. 7,217,977, 7,541,266 and 7,935,603 (incorporated by reference herein) describe the building of non-operable transistors that are either 'always-off' or 'always-on' in conventional planar complementary metal oxide semiconductor (CMOS) technology. These non-operable devices can be used to build a camouflage cell library in which a certain number of the logic cells in a standard logic cell library contain these non-operable transistors to alter the cells' logic functions. These camouflaged cells, with the non-operable devices, appear to be identical to the normal logic standard cells, and are extremely difficult to differentiate during reverse engineering.

With the latest developments in Fin field effect transistor (FinFET) technology, the bulk FinFET has replaced the conventional planar bulk CMOS and became the state-of-the-art semiconductor fabrication process for feature sizes of 22 nm and smaller. What is needed is a system and method for defining, fabricating, and using FinFETs camouflaged to disguise whether circuits are functionally connected to FinFET terminals. The methods and systems described herein satisfy that need.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

To address the requirements described above, this document discloses a camouflaged application specific integrated circuit including: at least one camouflaged FinFET, including: a substrate of a first conductivity type; a fin, disposed on the substrate, the fin including: a source region of a second conductivity type; a drain region of the second conductivity type; a channel region of the first conductivity type. The camouflaged application specific integrated circuit also includes a gate disposed over and substantially perpendicular to the channel region, forming one or more transistor junctions with the fin. In one embodiment, the substrate includes a punch through stop (PTS) region of the second conductivity type disposed between the fin and the substrate, the PTS region electrically shorting the source region of the fin to the drain region of the fin.

In one embodiment, the first conductivity type is p-type and the second conductivity type is n-type. In another embodiment the first conductivity type is n-type; and the second conductivity type is p-type. Another embodiment includes a source side extension region disposed between the channel region and the source region; and a drain side extension region disposed between the channel region and the drain region.

Another embodiment is evidenced by a method of producing a camouflaged FinFET, including: forming a substrate of a first conductivity type; forming a fin of a dielectric on the substrate, the fin having a source region, a drain region, and a channel region; placing punch through stop (pts) implants of a second conductivity type between the fin and the substrate; doping the channel region to the first conductivity type; forming a gate dielectric over only the channel region; and placing implants of the second conductivity type in the source region and the drain region.

In other embodiments, the PTS implants extend longitudinally at least from the source region to the drain region and electrically short the source region to the drain region. Placing the PTS implants of a second conductivity type between the fin and the substrate may include masking the fin and substrate to expose only an area between the fin and the substrate; and exposing the masked fin and substrate to an ion implant source.

The features, functions, and advantages that have been discussed can be achieved independently in various embodiments of the present invention or may be combined in yet other embodiments, further details of which can be seen with reference to the following description and drawings.

BRIEF DESCRIPTION OF THE DRAWINGS

Referring now to the drawings in which like reference numbers represent corresponding parts throughout.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Overview

In the fabrication of a Bulk FinFET, a Punch Through Stop (PTS) implant at the bottom of the Source/Drain and the channel region of the fin structure is required to suppress the punch through leakage current. The dopants used in the PTS implants are always the opposite polarity as the Source/Drain implants, i.e. P-type dopants such as Boron (B) are used for the PTS implant of the N-type FinFET while N-type dopants, typically Arsenic (As), are used for the P-type FinFET. By switching the PTS masking layers to have the N-type FinFET receiving the N-type (As) PTS implant, and the P-type FinFET receiving the P-type (B) implants, both the N-type and P-type FinFETs will turn the device into an 'Always-on' state. The PTS implants having the same dopant polarity as the source/drain will create a current conduction path between the source and drain of the FinFET.

Technology

Figure 1A:
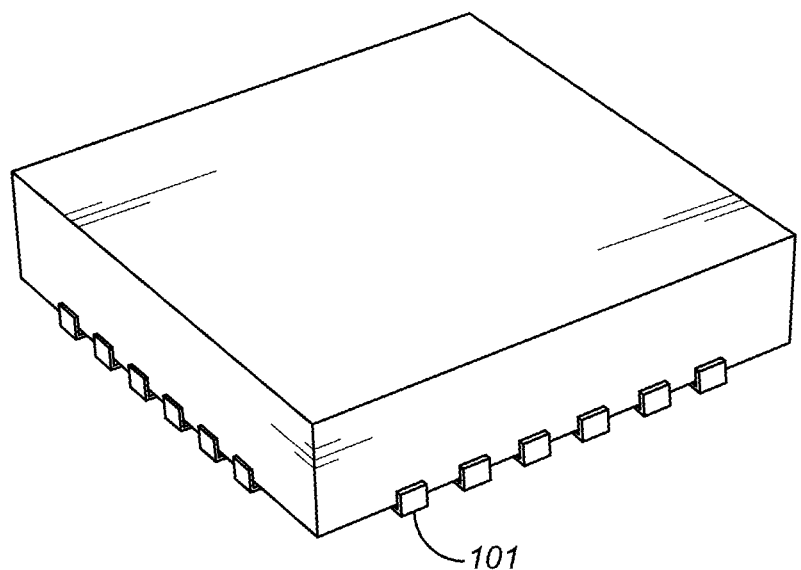
FIG. 1A is a diagram of an integrated circuit such as an application specific integrated circuit.

FIG. 1A is a diagram of an integrated circuit such as an application specific integrated circuit (ASIC) 100. The ASIC 100 comprises a plurality of pins 101, which together provide power and input signals to the ASIC and also provide output signals.

Figure 1B:
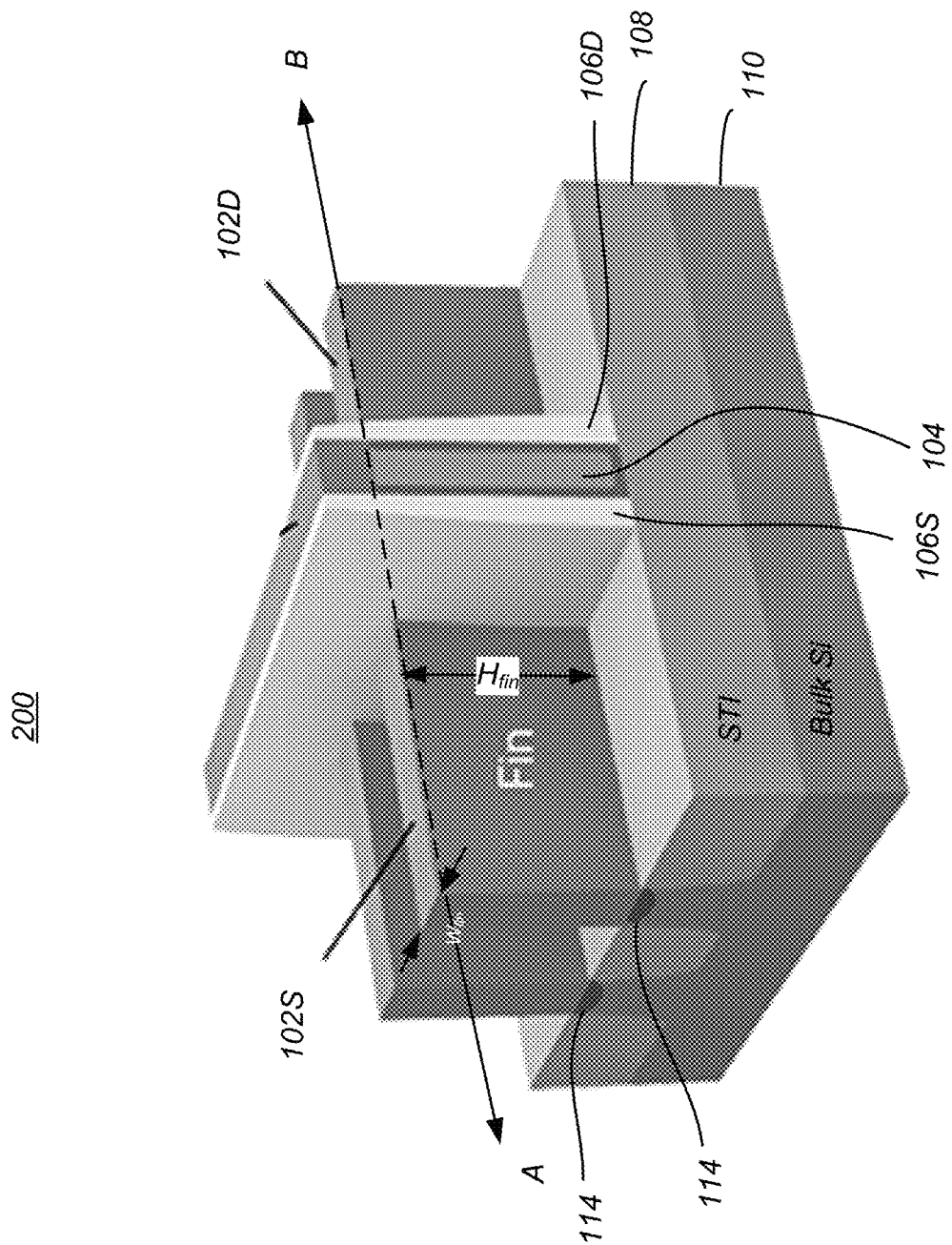
FIG. 1B is a diagram illustrating the basic structure of a standard FinFET transistor in three dimensions.

FIG. 1B is a diagram illustrating the basic structure of a standard FinFET transistor (hereinafter simply FinFET 200) in three dimensions. The FinFET 200 comprises a fin 102 formed on bulk silicon 110. A gate 104 having a source side gate spacer 106S and a drain side gate spacer 106D is disposed over and substantially perpendicular to the fin 102. A shallow trench isolation (STI) layer of the substrate 108 may also be employed. Punch-through stop (PTS) implants 114 to improve the "off" performance of the FinFET by reducing the leakage current due to punch-through may also be utilized.

To form a standard bulk FinFET, one or more fins 102 of height $H_{fin}$ and width $W_{fin}$ is formed on bulk silicon 110, for example, by a lithographic etch. This is followed by the STI layer of the substrate 108 to fill the gaps between fins 102, then planarization and oxide recessing to expose the fins 102 as illustrated.

Transistor junctions can then be formed on 3 sides (top, left and right) of the exposed fin 102. Current FinFET technologies no longer form transistor junctions on the top side of the fin 102 due to its complexity and adverse effects. Instead, FinFETs are only built on the left and right sides of the fin 102. N-well and P-well implants are then carried out to define the areas of the P-type and N-type FinFETs. P-type and N-type Punch Through Stop (PTS) implants 114 follow, as further described below.

Figure 2A:
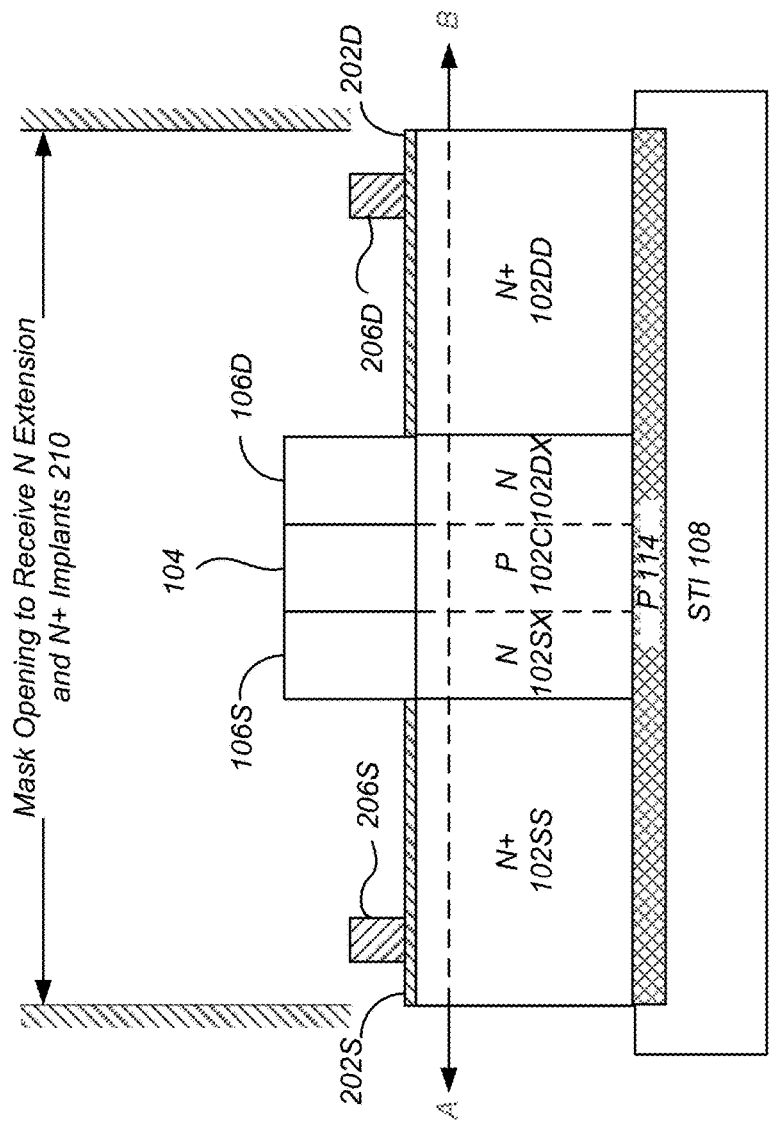
FIGS. 2A and 2B are diagrams illustrating a cross section of the exposed fin of the FinFET
Figure 2B:
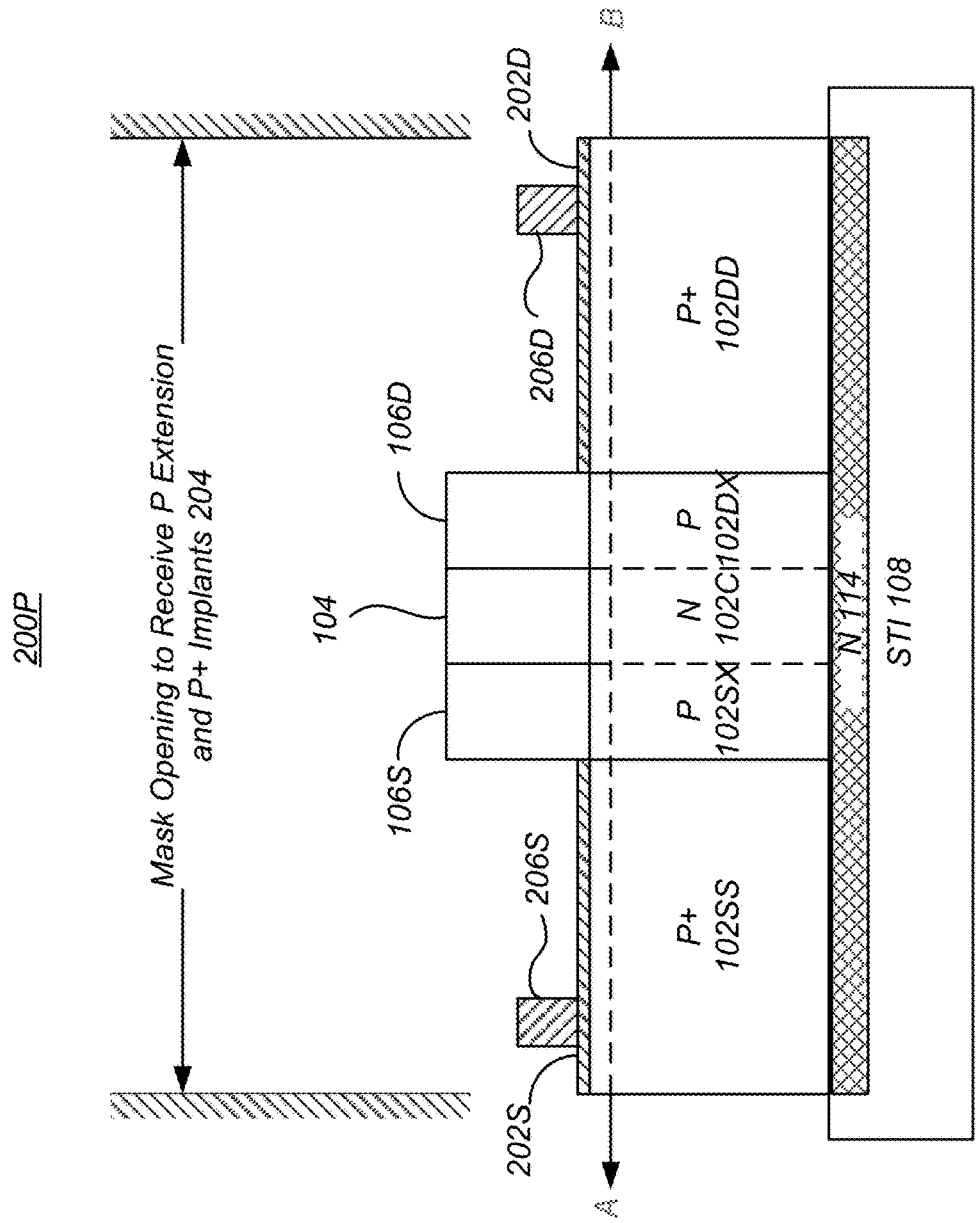

FIGS. 2A and 2B are diagrams illustrating a cross section of the exposed fin 102 of the FinFET. FIG. 2A depicts a side view of an N-type FinFET 200N along axis A-B, and FIG. 2B depicts a side view of a P-type FinFET 200P along the same axis.

Well implants are placed to give the correct dopants to the channel region 102C of the fin 102. P well implants are placed in the embodiment depicted in FIG. 2A and N well implants are depicted in the embodiment depicted in FIG. 2B.

A punch through stop (PTS) implant 114 in a PTS region may accompany the well implantation. In the normal (uncamouflaged)N-type FinFET 200N depicted in FIG. 2A, the whole fin 102 with the device channel is built on the P-well substrate. Its Punch Through Stop (PTS) implant 114 is P-doped type (Boron, B) which is the opposite polarity as the Source/Drain (Arsenic, As) implants 102S/102D of the N-type FinFET 200N. The function of the PTS implant 114 is to stop the drain-to-substrate junction depletion region merging into the source-to-substrate junction depletion region. When such a merge happens, a relatively large punch through current can occur.

For the normal (uncamouflaged) P-type FinFET 200P in FIG. 2B, the fin 102 is within the N well substrate and the PTS implant 114 is N-doped with Arsenic (As) while the P-type FinFET Source/Drain 102S/102D are heavily P-doped with Boron (B). Its PTS implant 114 serves the same purpose as the one in N-type FinFET to suppress the devices' punch through leakage current.

The N-type and P-type PTS implants 114 are carried out in two separate masking steps to protect the FinFET 200 devices from receiving the wrong type of implants. In other words, since multiple FinFETs 200 are to be disposed on an IC or SoC, a first mask is used for the FinFETs to receive N type PTS implants 114, and a second mask is used for the FinFETs to receive the P type PTS implants 114.

Next, a gate dielectric is grown and a deposition of polysilicon as a dummy gate follows. The dummy gate will be later replaced by a metal gate at the end of the process. After the dummy gate formation, source and drain extension implant is carried out by use of a mask 210 for the N-type FinFET 200N in FIG. 2A and another mask 204 for P-type FinFET 200P in FIG. 2B having the extension along the A-B axis.

The extension implant covers the source side extension region 102SX and the drain side extension region 102DX. The extension implant also covers the source, source span, drain and drain span regions, but this low dose implant is insignificant in these regions as they will subsequently receive dramatically higher dose implants. This is accomplished for the N channel of the N-type device 200N depicted in FIG. 2A and for the P channel of the P-type device 200P depicted in FIG. 2B. Halo implants may be added at this time together with the extension implant, for further device leakage control.

Next, gate spacers 106S and 106D are formed on both sides of the dummy poly gate 104 (source side gate spacer 106S and drain side gate spacer 106D). The gate spacers 106S and 106D cover the source side extension region 102SX and drain side extension region 102DX, respectively, and the silicon regions under the spacers are protected by the spacers from receiving the N+/P+ implants and that will increase the breakdown voltage and reduce the "short channel effect".

Then, N+ source and drain implant is provided to source region 102SS, and the drain region 102DD to the N-type device of FIG. 2A, with a P+ source and drain implant provided to analogous regions in the P-type device illustrated in FIG. 2B. To enhance carrier mobility of the channels, selective growth of epi-SiGe is implemented on the source region 102SS and drain region 102DD of the N-type device shown in FIG. 2A. Similarly, selective growth of epi-Si:C is implemented on the source region 102SS and drain region 102DD of the P-type device of FIG. 2B.

Self-aligned metal silicide (trench salicide) 202 is then deposited over the source and drain silicon areas (102SS and 102DD respectively) on the surface of the fin regions 102S and 102D to reduce source and drain resistance and to provide a good electrical connection with the FinFET device. The dummy poly gate is then removed and replaced with a high K dielectric and gate metal. The properties of the high K dielectric material are chosen for proper threshold voltage control of the FinFET.

Next is the implementation of the Middle-Of-Line (MOL) by depositing self-aligned contacts (SAC) 206 to make electrical connections the source region 102SS, drain region 102DD and gate 104 of the FinFETs to the Back-End-Of-Line (BEOL) metallization. After all the BEOL metal and via layers are deposited and patterns defined with lithography and etching, the process of making the Integrated Circuit (IC) in FinFET is completed and the IC is ready for testing and packaging.

Described below is a technique for changing the PTS implants 114 to make a FinFET device 300 (either N-type and P-type) become always on. By changing the mask design of both the P and N-type PTS implants 114, the resulting 'Always-on' FinFETs 300 will be blocked from receiving the correct polarity of the PTS implants 114 to form a normal (uncamouflaged) FinFET 200. Instead, they will receive the PTS implants 114 which have the same polarity as the FinFET's source and drain implants. The result is that the PTS implant 114 region electrically shorts the source region 102S of the fin 102 to the drain region 102D of the fin 102, rendering the FinFET 300 in an "Always-on" logic state. In one embodiment, the region of the PTS implants 114 (e.g. PTS implant region) is approximately along a longitudinal axis of the fin 120. A camouflaged integrated circuit such as an ASIC can be formed by forming a circuit having a mix of camouflaged and non-camouflaged FinFETs and other devices, so that reverse engineering is commercially inviable.

Figure 3A:
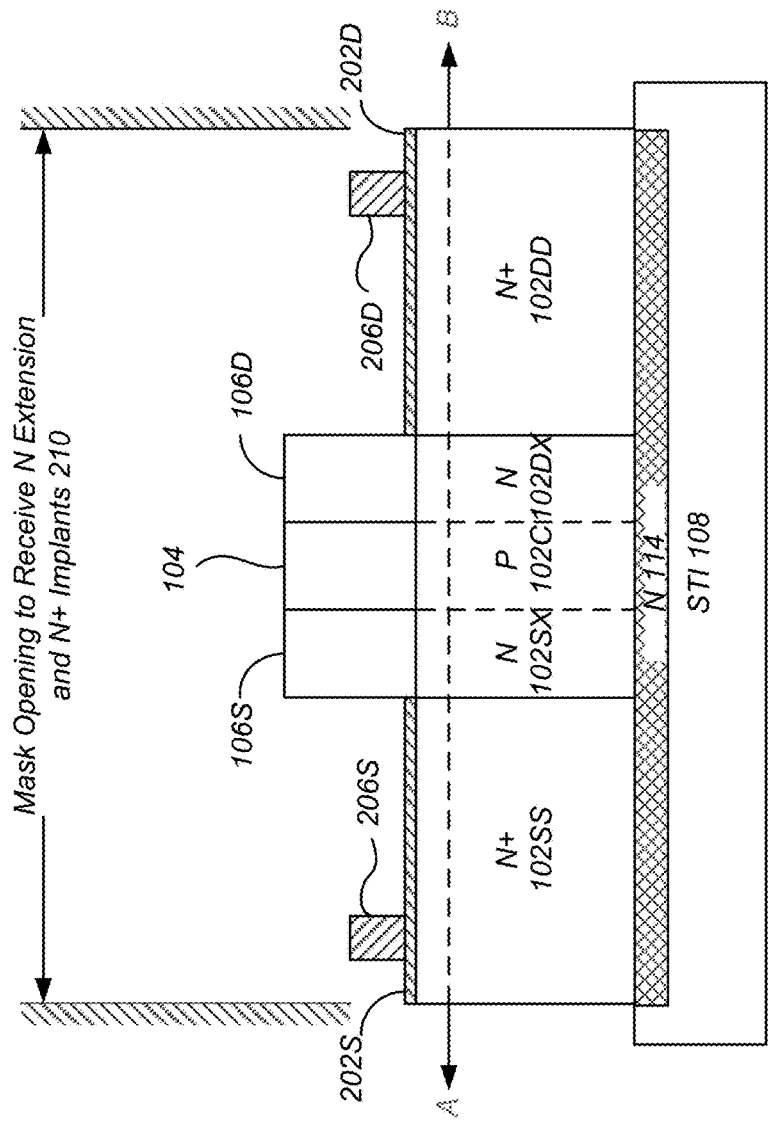
FIG. 3A is a diagram of a cross section of an N-type 'Always-on' FinFET.

FIG. 3A is a diagram of a cross section of an N-type 'Always-on' FinFET 300N. This 'Always-on' N-type FinFET 300N is blocked (by masking) from the P-type PTS implant 114 of Boron but open (by openings in the mask) to the N-type PTS implant 114 to receive the implant of Arsenic. Since the N-type PTS (As) implant 114 of the newly formed FinFET 300N is located at the bottom of the fin 102 and touching the N+ source 102S and drain 102D regions, a source 102S to drain 102D conduction path that is independent of the gate 104 voltage exists to make this N-type FinFET 300N to become 'Always-on'.

Figure 3B:
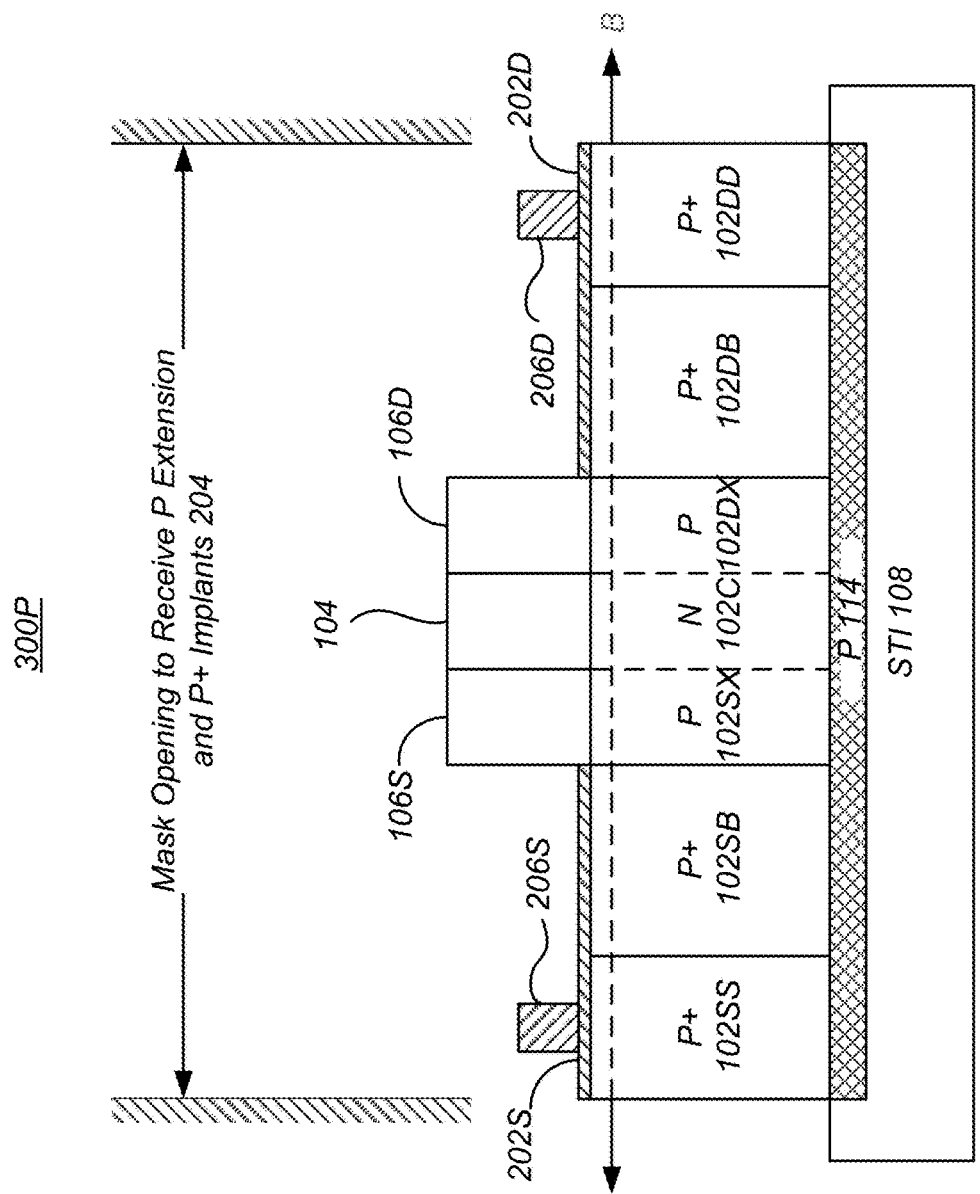
FIG. 3B is a diagram of a cross section of a P-type 'Always on' camouflaged FinFET.

FIG. 3B is a diagram of a cross section of a P-type 'Always on' camouflaged FinFET 300P. This type of FinFET 300P is created in a way similar to that of the N-type 'Always-on' FinFET 300N depicted in FIG. 3A. With the change of the PTS implant 114 masking, when the targeted P-type FinFET 300P is blocked from N-type PTS implant 114 of As but opened to P-type PTS implant 114 of Boron, the FinFET's source 102S is always shorted to the drain 102D through the Boron PTS implant 114. Again, it is the PTS Boron implant 114 under the source 102S and drain 102D that creates a short current path and results in the device 300P being turned on all the time.

In fabricating the FinFET 300, the locations of the PTS implants 114 are at the bottoms of the fins 102 and their thickness is small (<10 nm). It is difficult to detect their polarity and location in a reverse engineering attack. The rest of the layers in this 'Always-on' device 300 are totally identical to a normal FinFET 200. Reverse engineers will find it very difficult to differentiate such an 'Always-on' device 300 from a normal FinFET 200.

This kind of 'Always-on' device 300 is a good candidate, when combining with other circuit camouflage techniques, in the design of a camouflage FinFET digital logic standard cell library. The camouflage FinFET library will contain a certain number of camouflage logic cells that have identical physical layout patterns in all layers (except a few hard-to-detect layers) as the mimicked normal standard cells but which perform a different or no logic function. An ASIC designed with such a camouflaged FinFET library will be highly resistant to reverse engineering attack.

Figure 4A:
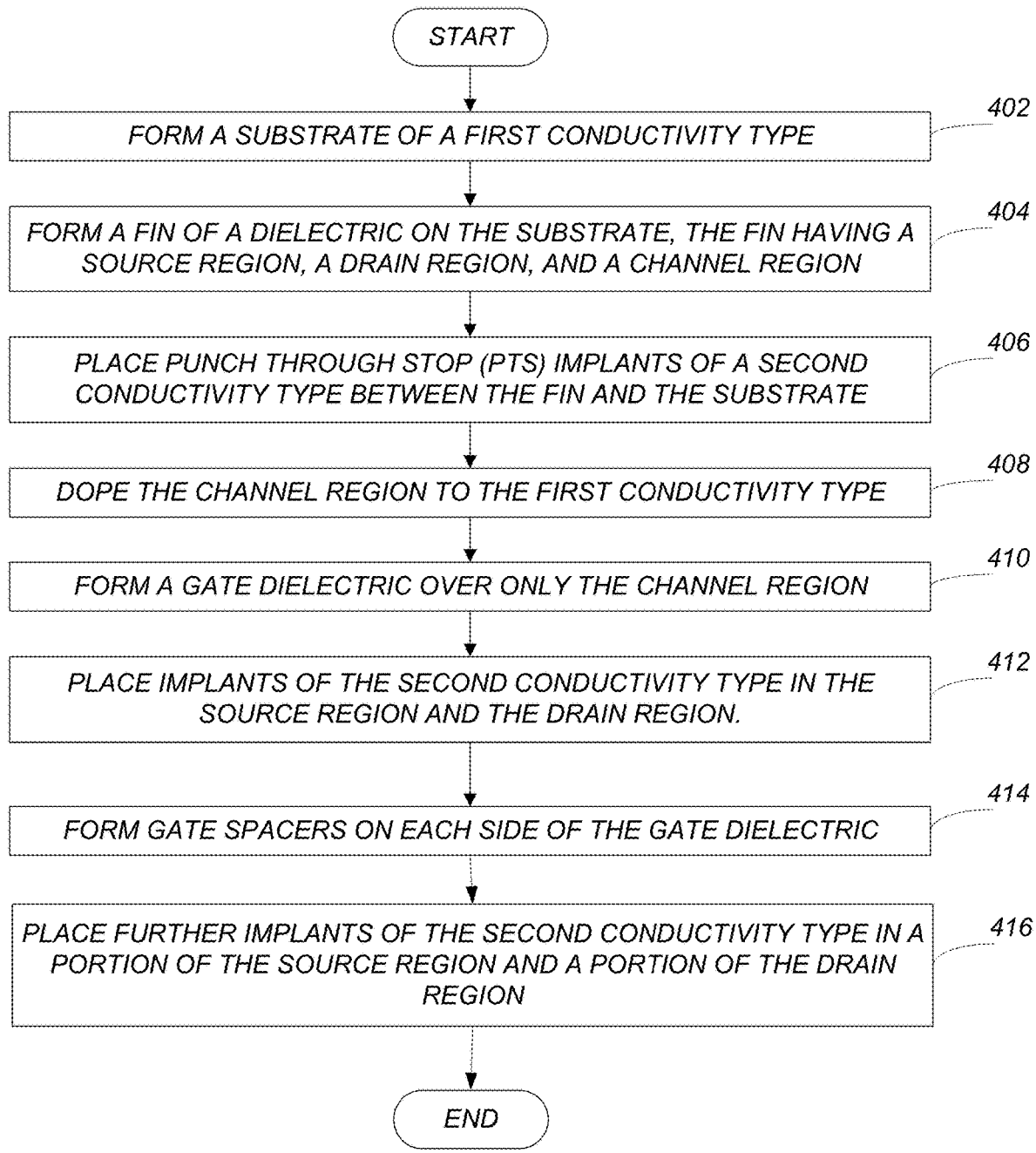
FIGS. 4A-4E are diagrams illustrating exemplary process steps that can be used to produce the camouflaged FinFET.

FIGS. 4A-4E are diagrams illustrating exemplary process steps that can be used to produce the camouflaged FinFET 300. Referring first to FIG. 4A, in block 402, a substrate 108 of a first conductivity type (e.g. P-type or N-type) is formed. In block 404, a fin 102 is formed of a dielectric on the substrate 108, the fin 102 having a source region 102S, a drain region 102D, and a channel region 102C.

Figure 4B:
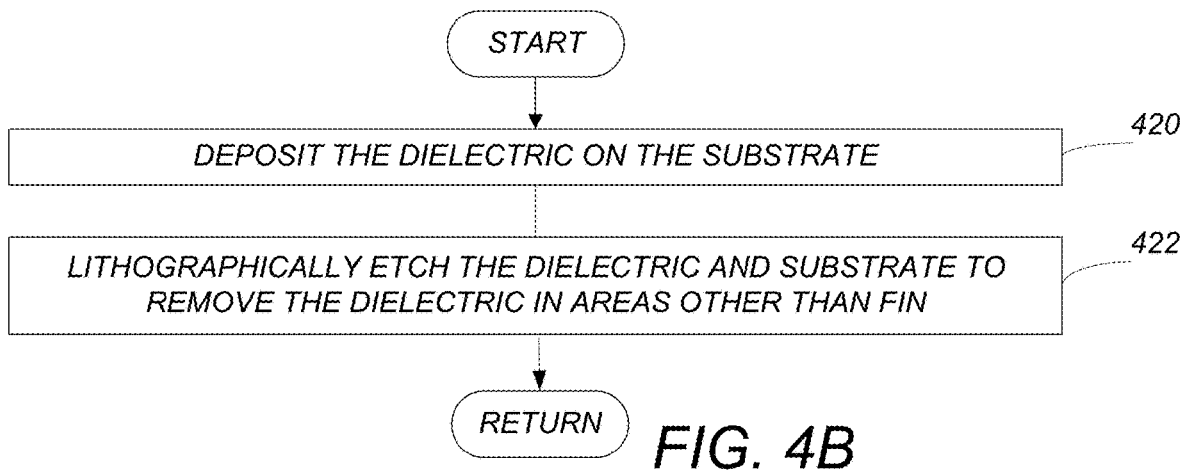

FIG. 4B is a diagram illustrating exemplary process steps used to form the fin 102 of the dielectric on the substrate 108. In block 420, the dielectric is deposited on the substrate 108. In block 422, the dielectric and substrate 108 are lithographically etched to remove the dielectric in areas other than the fin 102.

Returning to FIG. 4A, in block 406, PTS implant 114 of a second conductivity type (e.g. N-type if substrate is P-type and P-type if the substrate is N-type) are placed between the fin 102 and the substrate 108.

Figure 4C:
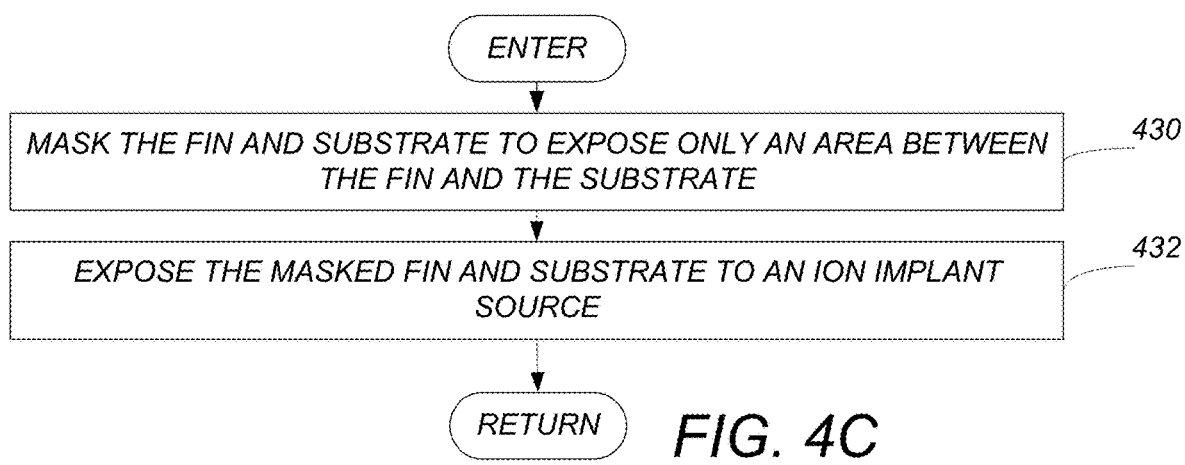

FIG. 4C is a diagram illustrating exemplary process steps used to place the PTS implant 114 of the second conductivity type between the fin 102 and the substrate 108. In block 430, the fin 102 and substrate 108 is masked to expose only an area between the fin 102 and substrate 108. In block 432, the masked fin 102 and substrate 108 is exposed to an ion implant source.

Returning to FIG. 4A, in block 408, the channel region 102C is doped to the first conductivity type.

Figure 4D:
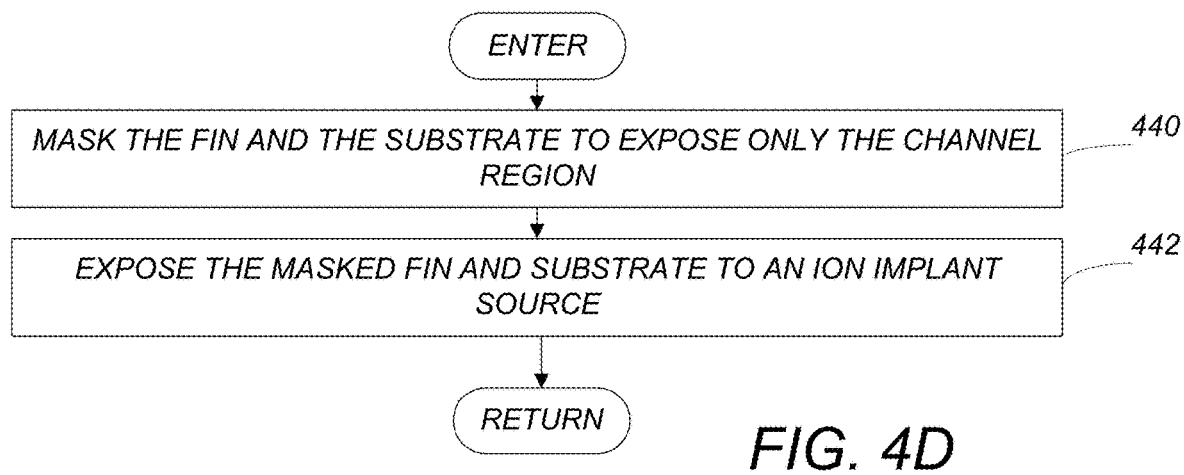

FIG. 4D is a diagram illustrating exemplary process steps for doping the channel region 102C to the first conductivity type. In block 440, the fin 102 and substrate 108 is masked to expose only the channel region 102C. In block 442, the masked fin 102 and substrate 108 is exposed to an ion implant source.

Returning to FIG. 4A, in block 410, a gate 104 is formed over only the channel region 102C. In block 412, implants of the second conductivity type are placed in the source region 102S and the drain region 102D of the fin 102.

Figure 4E:
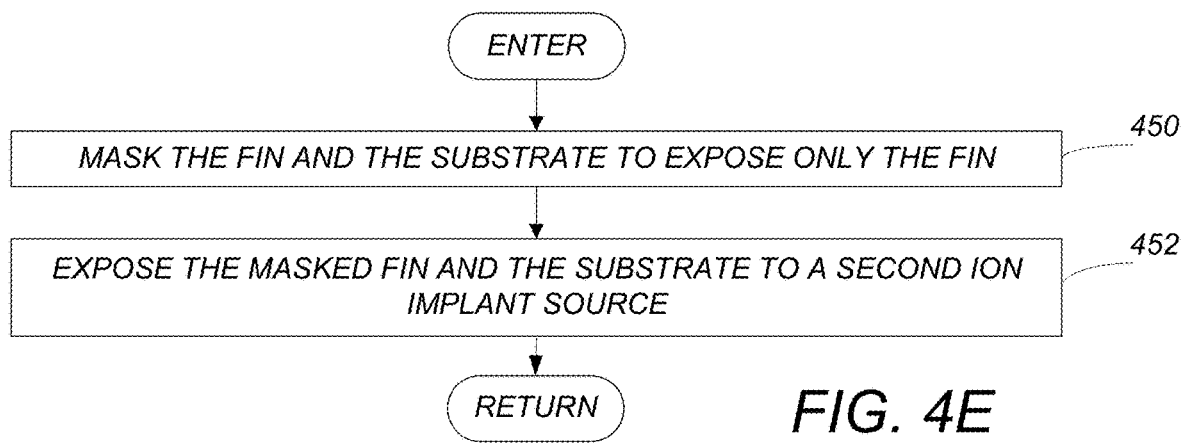

FIG. 4E is a diagram illustrating exemplary process steps for placing implants of the second conductivity type in the source region 102S and the drain region 102D. In block 450, the fin 102 and the substrate 108 are masked to expose only the fin 102. In block 452, the fin 102 and substrate 108 are exposed to a second ion implant source.

Returning to FIG. 4A, in block 414, gate spacers 106S and 106D are formed on each side of the gate dielectric 104, as shown in block 414. In block 416, further implants of the second conductivity type are placed in a portion 102SS of the source region 102S and a portion 102DD of the drain region.

CONCLUSION

This concludes the description of the preferred embodiments of the present disclosure.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A camouflaged application specific integrated circuit (ASIC) comprising:
    at least one camouflaged FinFET, comprising:
        a substrate of a first conductivity type;
        a fin, disposed on the substrate, the fin including:
            a source region of a second conductivity type;
            a drain region of the second conductivity type;
            a channel region of the first conductivity type; and
        a gate disposed over and substantially perpendicular to the channel region, the gate forming one or more transistor junctions with the fin;
        wherein the substrate comprises a punch through stop (PTS) region of the second conductivity type disposed between the fin and the substrate, the PTS region electrically shorting the source region of the fin to the drain region of the fin.

2. The camouflaged ASIC of claim 1, wherein:
    the first conductivity type is P-type; and
    the second conductivity type is N-type.

3. The camouflaged ASIC of claim 1, wherein:
    the first conductivity type is N-type; and
    the second conductivity type is P-type.

4. The camouflaged ASIC of claim 1, wherein:
    the fin further comprises:
        a source side extension region disposed between the channel region and the source region; and
        a drain side extension region disposed between the channel region and the drain region.

5. The camouflaged ASIC of claim 1, wherein the fin comprises a longitudinal axis and the PTS region runs along the longitudinal axis.

6. A camouflaged FinFET, comprising:
    a substrate of a first conductivity type;
    a fin, disposed on the substrate, the fin including:
        a source region of a second conductivity type;
        a drain region of the second conductivity type;
        a channel region of the first conductivity type; and
    a gate disposed over and substantially perpendicular to the channel region, the gate forming one or more transistor junctions with the fin;
    wherein the substrate comprises a punch through stop (PTS) region of the second conductivity type disposed between the fin and the substrate, the PTS region electrically shorting the source region of the fin to the drain region of the fin.

7. The camouflaged FinFET of claim 6, wherein:
    the first conductivity type is P-type; and
    the second conductivity type is N-type.

8. The camouflaged FinFET of claim 6, wherein:
    the first conductivity type is N-type; and
    the second conductivity type is P-type.

9. The camouflaged FinFET of claim 6, wherein:
    the fin further comprises:
        a source side extension region disposed between the channel region and the source region; and
        a drain side extension region disposed between the channel region and the drain region.

10. The camouflaged FinFET of claim 6, wherein the fin comprises a longitudinal axis and the PTS region runs along the longitudinal axis.

11. A method of producing a camouflaged FinFET, comprising:
    forming a substrate of a first conductivity type;
    forming a fin on the substrate, the fin having a source region, a drain region, and a channel region;
    placing punch through stop (PTS) implants of a second conductivity type between the fin and the substrate;
    doping the channel region to the first conductivity type;
    forming a gate dielectric over only the channel region; and
    placing implants of the second conductivity type in the source region and the drain region;
    wherein the PTS implants electrically short the source region of the fin to the drain region of the fin.

12. The method of claim 11, wherein the PTS implants extend longitudinally at least from the source region to the drain region and electrically short the source region to the drain region.

13. The method of claim 12, wherein placing punch through stop (PTS) implants of a second conductivity type between the fin and the substrate comprises:
    masking the fin and substrate to expose only an area between the fin and the substrate; and
    exposing the masked fin and substrate to an ion implant source.

14. The method of claim 12, wherein:
    forming the fin of the dielectric on the substrate, the fin having the source region, the drain region, and the channel region comprises:
        depositing the dielectric on the substrate; and
        lithographically etching the dielectric and substrate to remove the dielectric in areas other than fin;
    doping the channel region to the first conductivity type comprises;
        masking the fin and the substrate to expose only the channel region; and
        exposing the fin and dielectric masked to expose only the channel region to an ion implant source; and
    placing implants of the second conductivity type in the source region and the drain region comprises:
        masking the fin and the substrate to expose only the fin; and
        exposing the masked fin and substrate to a second ion implant source.

15. The method of claim 12, further comprising:
    forming gate spacers on each side of the gate dielectric; and
    placing further implants of the second conductivity type in a portion of the source region and a portion of the channel region.

16. The method of claim 12, wherein:
    the first conductivity type is P-type; and
    the second conductivity type is N-type.

17. The method of claim 12, wherein:
    the first conductivity type is N-type; and
    the second conductivity type is P-type.

18. The method of claim 12, wherein the fin comprises a longitudinal axis and the PTS implants run along the longitudinal axis.

19. A camouflaged FinFET, formed by performing steps comprising the steps of:
    forming a substrate of a first conductivity type;
    forming a fin on the substrate, the fin having a source region, a drain region, and a channel region;

placing punch through stop (PTS) implants of a second conductivity type between the fin and the substrate;

doping the channel region to the first conductivity type;

forming a gate dielectric over only the channel region; and placing implants of the second conductivity type in the source region and the drain region;

wherein the PTS implants electrically short the source region of the fin to the drain region of the fin.

20. The camouflaged FinFET of claim 19, wherein the PTS implants extend longitudinally at least from the source region to the drain region and electrically short the source region to the drain region.

\* \* \* \* \*